(12) United States Patent
Gao et al.

(10) Patent No.: US 10,460,673 B2
(45) Date of Patent: Oct. 29, 2019

(54) PIXEL CIRCUIT, METHOD FOR DRIVING THE SAME, AND DISPLAY PANEL

(71) Applicant: SHANGHAI TIANMA AM-OLED CO., LTD., Shanghai (CN)

(72) Inventors: Yana Gao, Shanghai (CN); Dongxu Xiang, Shanghai (CN); Renyuan Zhu, Shanghai (CN); Yue Li, Shanghai (CN); Zeyuan Chen, Shanghai (CN); Zhonglan Cai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 71 days.

(21) Appl. No.: 15/867,507

(22) Filed: Jan. 10, 2018

(65) Prior Publication Data

US 2018/0130424 A1 May 10, 2018

(30) Foreign Application Priority Data

Jul. 31, 2017 (CN) .......................... 2017 1 0642946

(51) Int. Cl.
*G09G 3/3291* (2016.01)
*H01L 27/12* (2006.01)
*H01L 29/786* (2006.01)

(52) U.S. Cl.
CPC ....... *G09G 3/3291* (2013.01); *H01L 27/1251* (2013.01); *H01L 29/78645* (2013.01); *H01L 29/78696* (2013.01); *G09G 2300/0842* (2013.01); *G09G 2320/0233* (2013.01); *G09G 2320/0257* (2013.01); *G09G 2320/043* (2013.01)

(58) Field of Classification Search
CPC ......... G09G 3/3291; G09G 2320/0233; G09G 2320/043; G09G 2320/0257; H01L 29/78696; H01L 29/78645
See application file for complete search history.

(56) References Cited

U.S. PATENT DOCUMENTS

2015/0187266 A1\* 7/2015 Qian .................... G09G 3/3233
345/77
2019/0051238 A1\* 2/2019 Zhang .................. G09G 3/3233

FOREIGN PATENT DOCUMENTS

| CN | 104318897 A | 1/2015 |
| CN | 105427800 A | 3/2016 |
| CN | 105575327 A | 5/2016 |
| CN | 106448560 A | 2/2017 |
| CN | 106710529 A | 5/2017 |

\* cited by examiner

*Primary Examiner* — Alexander Eisen
*Assistant Examiner* — Kebede T Teshome
(74) *Attorney, Agent, or Firm* — Alston & Bird LLP

(57) ABSTRACT

The disclosure discloses a pixel circuit, a method for driving the same, and a display panel. Before a drive control module controls a drive transistor to drive a light emitting device to emit light, a node reset module provides a gate of the drive transistor with a signal of a first voltage terminal; and also while the node reset module is providing the gate of the drive transistor with the signal of the first voltage terminal, a light emitting control module provides a first electrode of the drive transistor with the signal of the first voltage terminal.

18 Claims, 12 Drawing Sheets

PIXEL CIRCUIT, METHOD FOR DRIVING THE SAME, AND DISPLAY PANEL

CROSS-REFERENCE TO RELATED APPLICATION

This Application claims priority to Chinese Patent Application No. CN201710642946.1, filed on Jul. 31, 2017, the content of which is incorporated by reference in the entirety.

FIELD

The present disclosure relates to the field of display technologies, and particularly to a pixel circuit, a method for driving the same, and a display panel.

BACKGROUND

An Organic Light emitting Diode (OLED) display is one of the focuses in the research field of flat panel displays at present. OLED has lower power consumption, a lower production cost, self-illuminating, a wider angle of view, a higher response speed, and other advantages as compared with a Liquid Crystal Display (LCD). At present, the OLED displays have taken the place of the traditional LCD displays in the flat panel display fields of a mobile phone, a Personal Digital Assistant (PDA), a digital camera, etc., where the design of a pixel circuit is a core technology of the OLED display, and a research thereon is of great significance.

SUMMARY

Embodiments of the disclosure provide a pixel circuit, a method for driving the same, and a display panel.

In one aspect, an embodiment of the disclosure provides a pixel circuit including: a drive transistor, a drive control module, a light emitting control module, a node reset module, a node initialization module, and a light emitting device; wherein the drive control module is configured to control the drive transistor to drive the light emitting device to emit light; wherein the node reset module is configured to provide a gate of the drive transistor with a signal of a first voltage terminal before the drive control module controls the drive transistor to drive the light emitting device to emit light; wherein the node initialization module is configured to provide the gate of the drive transistor with a signal of a reference signal terminal Vref after the node reset module provides the gate of the drive transistor with the signal of the first voltage terminal, and before the drive control module controls the drive transistor to drive the light emitting device to emit light, wherein voltage of the reference signal terminal is different from voltage of the first voltage terminal; and wherein the light emitting control module is configured to provide a first electrode of the drive transistor with the signal of the first voltage terminal when the node reset module is providing the gate of the drive transistor with the signal of the first voltage terminal, and wherein the light emitting control module is configured to provide an anode of the light emitting device with the signal of the first voltage terminal through the drive transistor when the light emitting device is emitting light.

In another aspect, an embodiment of the disclosure further provides a method for driving the pixel circuit above, the method including: a first stage of providing a first scan signal terminal, a first light emitting control terminal, and a second light emitting control terminal with a first level signal, and providing a second scan signal terminal and a third scan signal terminal with a second level signal; a second stage of providing the second scan signal terminal with the first level signal, and providing the first light emitting control terminal, the second light emitting control terminal, the first scan signal terminal, and the third scan signal terminal with the second level signal; a third stage of providing the third scan signal terminal with the first level signal, and providing the first light emitting control terminal, the second light emitting control terminal, the first scan signal terminal, and the second scan signal terminal with the second level signal; and a fourth stage of providing the first light emitting control terminal and the second light emitting control terminal with the first level signal, and providing the first scan signal terminal, the second scan signal terminal, and the third scan signal terminal with the second level signal.

In still another aspect, an embodiment of the disclosure further provides a display panel including N rows of pixel circuits according to the embodiment above of the disclosure, and N+2 scan lines; wherein the first scan signal terminals of an n-th row of pixel circuits are connected with an n-th scan line, the second scan signal terminals of the n-th row of pixel circuits are connected with an (n+1)-th scan line, and the third scan signal terminals of the n-th row of pixel circuits are connected with an (n+2)-th scan line, wherein n=1, 2, 3, . . . , N, and wherein N is an integer greater than 0.

BRIEF DESCRIPTION OF THE DRAWINGS

In order to make the technical solutions according to the embodiments of the present disclosure more apparent, the drawings to which a description of the embodiments refers will be briefly introduced below, and apparently the drawings to be described below are merely illustrative of some of the embodiments of the present disclosure, and those ordinarily skilled in the art can derive from these drawings other drawings without any inventive effort.

DETAILED DESCRIPTION OF THE EMBODIMENTS

Figure 1:
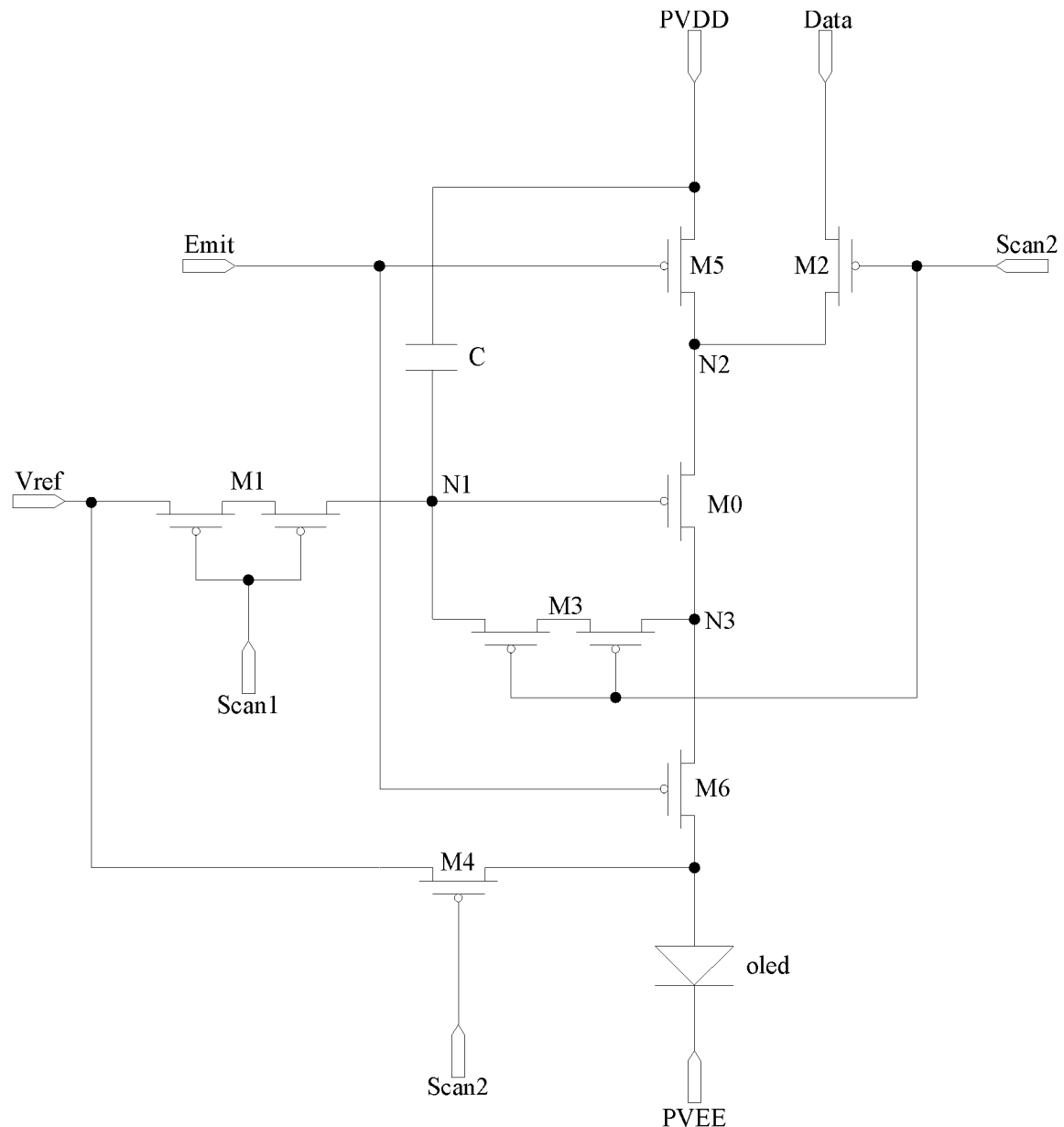
FIG. 1 is a schematic circuit diagram of a pixel circuit in the related art.
Figure 2:
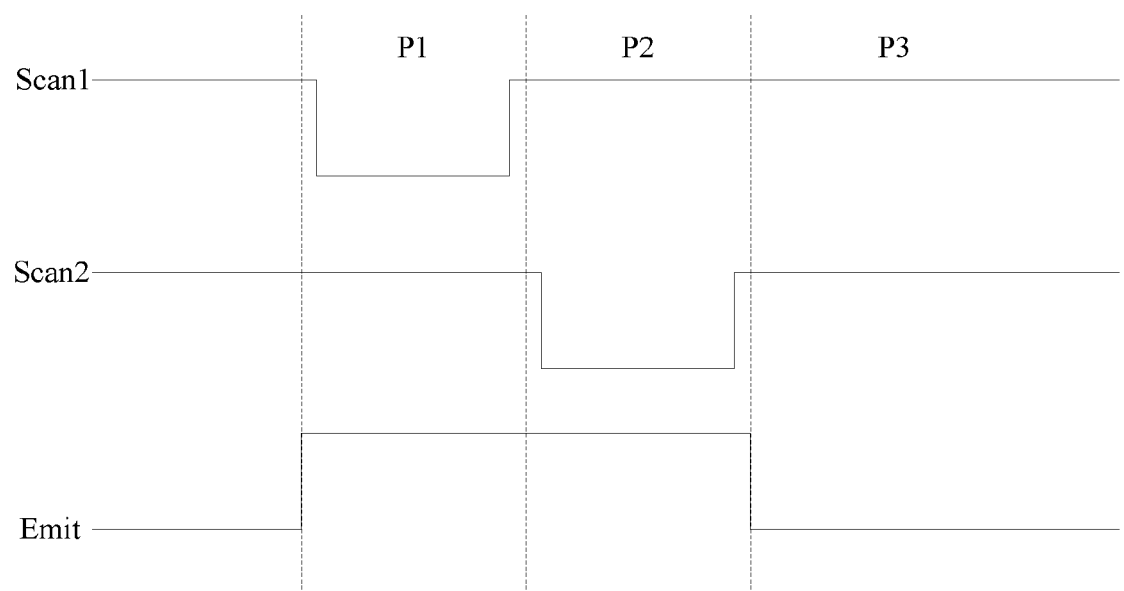
FIG. 2 is an input time sequence diagram corresponding to the pixel circuit in the related art.

FIG. 1 illustrates a circuit diagram of a pixel circuit in the related art including six switch transistors M1 to M6, one drive transistor M0, and one capacitor C. FIG. 2 illustrates a corresponding input time sequence diagram thereof. Although internal compensation in the circuit alleviates the problem of non-uniformity of a displayed image arising from drifting of threshold voltage of the drive transistor M0 due to a process factor, and aging of the transistor, there is inconsistent brightness of the first frame after the image is switched between high and low grayscales. Furthermore after the pixel circuit emits light for a period of time, the threshold voltage of the drive transistor M0 may deviate due to a bias stress that results in an afterimage.

As a result of a simulation on the pixel circuit illustrated in FIG. 1, when the (n−1)-th frame is at the grayscale 0, the n-th frame is at the grayscale 255, and the (n+1)-th frame is at the grayscale 255, potentials of a first node N1 and a second node N2 in different periods of time are detected as depicted in Table 1 below.

TABLE 1

| | Grayscale | | | | | |
|---|---|---|---|---|---|---|
| | 0 | | 255 | | 255 | |
| Frame No. | (n − 1)-th frame | | n-th frame | | (n + 1)-th frame | |
| Stage | Light emitting Stage | Initialization Stage | Data writing Stage | Light emitting Stage | Initialization Stage | Data writing Stage |
| N1 | 3.44 | −3 | 1.03 | 1.5 | −3 | 1.02 |
| N2 | 4.6 | −0.65 | 3.5 | 4.6 | 0.15 | 3.5 |

As can be apparent from Table 1 above, the potential of the second node N2 in the n-th frame is different from the potential of the second node N2 in the (n+1)-th frame in the initialization stage. This is because the first node N1 is switched to the potential −3V in the n-th frame from 3.44V, in the initialization stage, so the voltage of the first node N1 is changed by $\Delta V=6.44V$; and the first node N1 is switched to the potential −3V in the (n+1)-th frame from 1.5V, in the initialization stage, so the voltage of the first node N1 is changed by $\Delta V=4.5V$; and there is a parasitic capacitance between the first node N1 and the second node N2 in the pixel circuit, and the second node N2 is floating in the initialization stage, so there is such a different change in voltage $\Delta V$ of the first node N1 that the potential of the second node N2 in the n-th frame is different from the potential of the second node N2 in the (n+1)-th frame in the initialization stage, so that the potential of the first node N1 in the n-th frame is different from the potential of the first node N1 in the (n+1)-th frame in the data writing stage, thus resulting in such a problem that the brightness of the n-th frame is different from the brightness of the (n+1)-th frame.

In view of this, embodiments of the disclosure provide a pixel circuit, a method for driving the same, and an organic electroluminescent display panel to thereby reset the potentials of both the first node N1 and the second node N2 in the initialization stage so as to address the problem of different brightness arising from their difference in potential due to the parasitic capacitance between them.

In order to make the objects, technical solutions, and advantages of the embodiments of the disclosure more apparent, particular implementations of the pixel circuit, the method for driving the same, and the organic electroluminescent display panel according to the embodiments of the disclosure will be described below in details with reference to the drawings. It shall be noted that the preferred embodiments to be described below are merely intended to illustrate and explain the disclosure, but not to limit the disclosure thereto; and the embodiments of the disclosure and the features in the embodiments can be combined with each other unless they conflict with each other.

Figure 3:
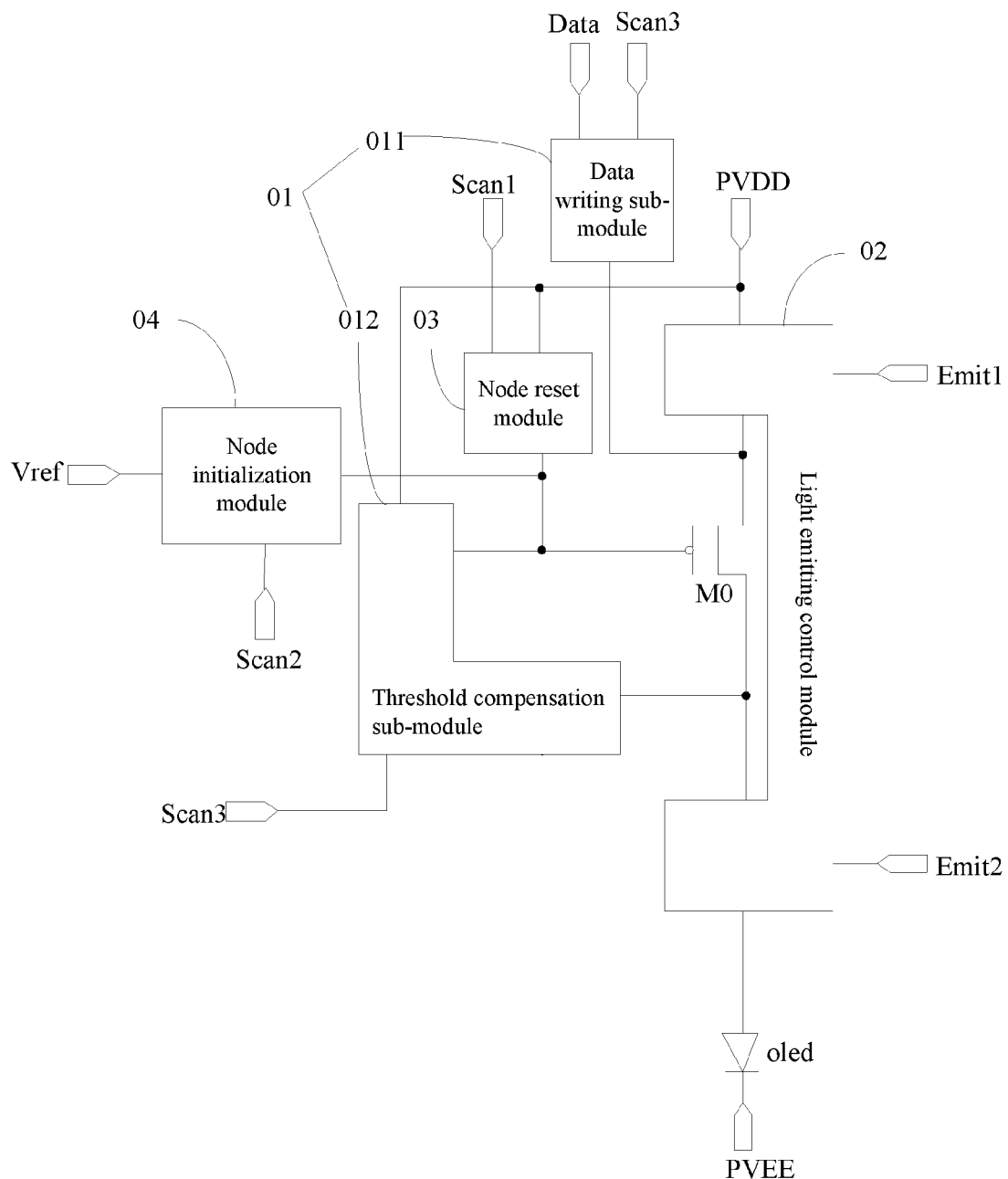
FIG. 3 is a schematic circuit diagram of a pixel circuit according to an embodiment of the disclosure.

An embodiment of the disclosure provides a pixel circuit as illustrated in FIG. 3 including a drive transistor M0, a drive control module 01, a light emitting control module 02, a node reset module 03, a node initialization module 04, and a light emitting device oled, where: the drive control module 01 is configured to control the drive transistor M0 to drive the light emitting device oled to emit light; the node reset module 03 is configured to provide a gate of the drive transistor M0 with a signal of a first voltage terminal PVDD before the drive control module 01 controls the drive transistor M0 to drive the light emitting device oled to emit light; the node initialization module 04 is configured to provide the gate of the drive transistor M0 with a signal of a reference signal terminal Vref after the node reset module 03 provides the gate of the drive transistor M0 with the signal of the first voltage terminal PVDD, and before the drive control module 01 controls the drive transistor M0 to drive the light emitting device oled to emit light, where voltage of the reference signal terminal Vref is different from voltage of the first voltage terminal PVDD; and the light emitting control module 02 is configured to provide a first electrode of the drive transistor M0 with the signal of the first voltage terminal PVDD when the node reset module 03 is providing the gate of the drive transistor M0 with the signal of the first voltage terminal PVDD, and to provide an anode of the light emitting device oled with the signal of the first voltage terminal PVDD through the drive transistor M0 when the light emitting device oled is emitting light.

In the pixel circuit according to the embodiment of the disclosure, before the drive control module controls the drive transistor to drive the light emitting device to emit light, the node reset module provides the gate of the drive transistor with the signal of the first voltage terminal; and also while the node reset module is providing the gate of the drive transistor with the signal of the first voltage terminal, the light emitting control module provides the first electrode of the drive transistor with the signal of the first voltage terminal, that is, both the gate and the first electrode of the drive transistor are reset using the signal of the first voltage terminal before the light emitting device emits light to thereby avoid their difference in voltage arising from a parasitic capacitance between them so as to avoid the problem of threshold voltage being differently grabbed due to a voltage jump, thus guaranteeing consistent brightness of the first frame after the image is switched between high and low grayscales. Furthermore the drive transistor is completely reset in the initialization stage of each frame, so that also an afterimage can be prevented from occurring as a result of the deviating threshold voltage of the drive transistor.

In some embodiments, in the pixel circuit according to the embodiment of the disclosure, a cathode of the light emitting device oled is connected with a second voltage terminal PVEE as illustrated in FIG. 3, where voltage of the second voltage terminal PVEE is typically negative or ground voltage.

In some embodiments, in the pixel circuit according to the embodiment of the disclosure, the light emitting device is typically an organic light emitting diode, although the embodiment of the disclosure will not be limited thereto.

The disclosure will be described below in details with reference to particular embodiments thereof. It shall be noted that the embodiments are intended to better set forth the disclosure, but not to limit the disclosure thereto.

Optionally in the pixel circuit according to the embodiment of the disclosure, as illustrated in FIG. 3, the drive control module 01 includes a data writing sub-module 011 and a threshold compensation sub-module 012, where: the data writing sub-module 011 is configured to provide the first electrode of the drive transistor M0 with a data signal of a data signal terminal Data under control of a third scan signal terminal Scan3; and the threshold compensation sub-module 012 is configured to write the data signal received at the first electrode of the drive transistor M0, and threshold voltage of the drive transistor M0 into the gate of the drive transistor M0 under control of the third scan signal terminal Scan3.

In some embodiments, the data writing sub-module is controlled by the third scan signal terminal to provide the first electrode of the drive transistor with the data signal of the data signal terminal, and the threshold compensation sub-module is controlled by the third scan signal terminal to write the data signal received at the first electrode of the drive transistor, and the threshold voltage of the drive transistor into the gate of the drive transistor, so that current of the drive transistor flowing to the light emitting device will not be affected by the threshold voltage of the drive transistor.

Of course, in a particular implementation, the particular structure of the drive control module can alternatively be another structure capable of writing the data signal and the threshold voltage, although the embodiment of the disclosure will not be limited thereto.

Optionally in the pixel circuit according to the embodiment of the disclosure, as illustrated in FIG. 3, the node reset module 03 is configured to provide the gate of the drive transistor M0 with the signal of the first voltage terminal PVDD under control of a first scan signal terminal Scan1.

The node initialization module 04 is configured to provide the gate of the drive transistor M0 with the signal of the reference signal terminal Vref under control of a second scan signal terminal Scan2.

The light emitting control module 02 is configured to provide the first electrode of the drive transistor M0 with the signal of the first voltage terminal PVDD under control of a first light emitting control terminal Emit1, and to connect a second electrode of the drive transistor M0 with the anode of the light emitting device oled under control of a second light emitting control terminal Emit2.

As such, the node reset module is controlled by the first scan signal terminal to provide the gate of the drive transistor with the signal of the first voltage terminal, and also the light emitting control module is controlled by the first light emitting control terminal to provide the first electrode of the drive transistor with the signal of the first voltage terminal, so that the gate and the first electrode of the drive transistor are reset; thereafter the node initialization module is controlled by the second scan signal terminal to reset the gate of the drive transistor using the signal of the reference signal terminal; then the drive control module is controlled by the third scan signal terminal to write the data signal, and the threshold voltage of the drive transistor into the gate of the drive transistor, and to enable the drive transistor to generate the drive current from the data signal independently of the threshold voltage of the drive transistor; and lastly the light emitting control module is controlled by the first light emitting control terminal and the second light emitting control terminal to enable the drive current of the drive transistor to flow to the light emitting device to drive the light emitting device to emit light.

In some embodiments, in order to reduce the number of signal ports, and to save a wiring space, in the pixel circuit according to the embodiment of the disclosure, the first light emitting control terminal and the second light emitting control terminal are the same control terminal.

Optionally in the pixel circuit according to the embodiment of the disclosure, as illustrated in FIG. 4 to FIG. 8, the pixel circuit further includes an anode reset module 05, where: the anode reset module 05 is configured to provide the anode of the light emitting device oled with the signal of the reference signal terminal Vref under control of the third scan signal terminal Scan3, or the second scan signal terminal Scan2, or the first scan signal terminal Scan1, so that the light emitting device can emit light in the current frame without being affected by voltage thereof while emitting light in the last frame.

Optionally in the pixel circuit according to the embodiment of the disclosure, as illustrated in FIG. 4 to FIG. 8, the node initialization module 04 includes a first switch transistor M1, where: the first switch transistor M1 has a gate connected with the second scan signal terminal Scan2, a first electrode connected with the reference signal terminal Vref, and a second electrode connected the gate of the drive transistor M0.

In some embodiments, when the first switch transistor M1 is controlled by the second scan signal terminal Scan2 to be turned on, the signal of the reference signal terminal Vref is transmitted to the gate of the drive transistor M0 through the first switch transistor M1 to thereby reset the gate of the drive transistor M0.

In some embodiments, in the pixel circuit according to the embodiment of the disclosure, as illustrated in FIG. 4 to FIG. 8, the first switch transistor M1 is structured with dual gates, so that leakage current in the first switch transistor M1 which is turned off can be reduced to thereby lower interference to the drive transistor M0 from the leakage current in the first switch transistor M1 in the light emitting stage, which would otherwise affect the drive current of the drive transistor M0.

The particular structure of the node initialization module in the pixel circuit has been described above only by way of an example, and in a particular implementation, the particular structure of the node initialization module will not be limited to the structure above according to the embodiment of the disclosure, but can alternatively be another structure known to those skilled in the art, so the embodiment of the disclosure will not be limited thereto.

Optionally in the pixel circuit according to the embodiment of the disclosure, as illustrated in FIG. 4 to FIG. 8, the threshold compensation sub-module 012 includes a second switch transistor M2 and a capacitor C1, where: the second switch transistor M2 has a gate connected with the third scan signal terminal Scan3, a first electrode connected with the second electrode of the drive transistor M0, and a second electrode connected with the gate of the drive transistor M0; and the capacitor C1 has one terminal connected with the first voltage terminal PVDD, and the other terminal connected with the gate of the drive transistor M0.

In some embodiments, when the second switch transistor M2 is controlled by the third scan signal terminal Scan3 to be turned on, the second switch transistor M2 which is turned on turns the drive transistor M0 into a diode structure, and the data signal received at the first electrode of the drive transistor M0 arrives at the gate of the drive transistor M0 through the drive transistor M0 in the diode structure, so that the data signal, and the threshold voltage of the drive transistor M0 are written into the gate of the drive transistor M0. The potential of the gate of the drive transistor M0 is maintained due to the capacitor C1 while the light emitting device oled is emitting light.

Optionally in the pixel circuit according to the embodiment of the disclosure, as illustrated in FIG. 4 to FIG. 8, the second switch transistor M2 is structured with dual gates, so that leakage current in the second switch transistor M2 which is turned off can be reduced to thereby lower interference to the drive transistor M0 from the leakage current in the second switch transistor M2 in the light emitting stage, which would otherwise affect the drive current of the drive transistor M0.

The particular structure of the threshold compensation sub-module in the pixel circuit has been described above only by way of an example, and in a particular implementation, the particular structure of the threshold compensation sub-module will not be limited to the structure above according to the embodiment of the disclosure, but can alternatively be another structure known to those skilled in the art, so the embodiment of the disclosure will not be limited thereto.

Optionally in the pixel circuit according to the embodiment of the disclosure, as illustrated in FIG. 4 to FIG. 8, the data writing sub-module 011 includes a third switch transistor M3, where: the third switch transistor M3 has a gate connected with the third scan signal terminal Scan3, a first electrode connected with the data signal terminal Data, and a second electrode connected with the first electrode of the drive transistor M0.

In some embodiments, in the pixel circuit according to the embodiment of the disclosure, when the third switch transistor M3 is controlled by the third scan signal terminal Scan3 to be turned on, the data signal of the data signal terminal Data is transmitted to the first electrode of the drive transistor M0 through the third switch transistor M3 to thereby write the data signal.

The particular structure of the data writing sub-module in the pixel circuit has been described above only by way of an example, and in a particular implementation, the particular structure of the data writing sub-module will not be limited to the structure above according to the embodiment of the disclosure, but can alternatively be another structure known to those skilled in the art, so the embodiment of the disclosure will not be limited thereto.

Optionally in the pixel circuit according to the embodiment of the disclosure, as illustrated in FIG. 4 to FIG. 8, the node reset module 03 includes a fourth switch transistor M4, where: the fourth switch transistor M4 has a gate connected with the first scan signal terminal Scant, a first electrode connected with the first voltage terminal PVDD, and a second electrode connected with the gate of the drive transistor M0.

In some embodiments, in the pixel circuit according to the embodiment of the disclosure, when the fourth switch transistor M4 is controlled by the first scan signal terminal Scant to be turned on, the signal of the first voltage terminal PVDD is transmitted to the gate of the drive transistor M0 through the fourth switch transistor M4 to thereby reset the gate of the drive transistor M0.

The particular structure of the node reset module in the pixel circuit has been described above only by way of an example, and in a particular implementation, the particular structure of the node reset module will not be limited to the structure above according to the embodiment of the disclosure, but can alternatively be another structure known to those skilled in the art, so the embodiment of the disclosure will not be limited thereto.

Figure 4:
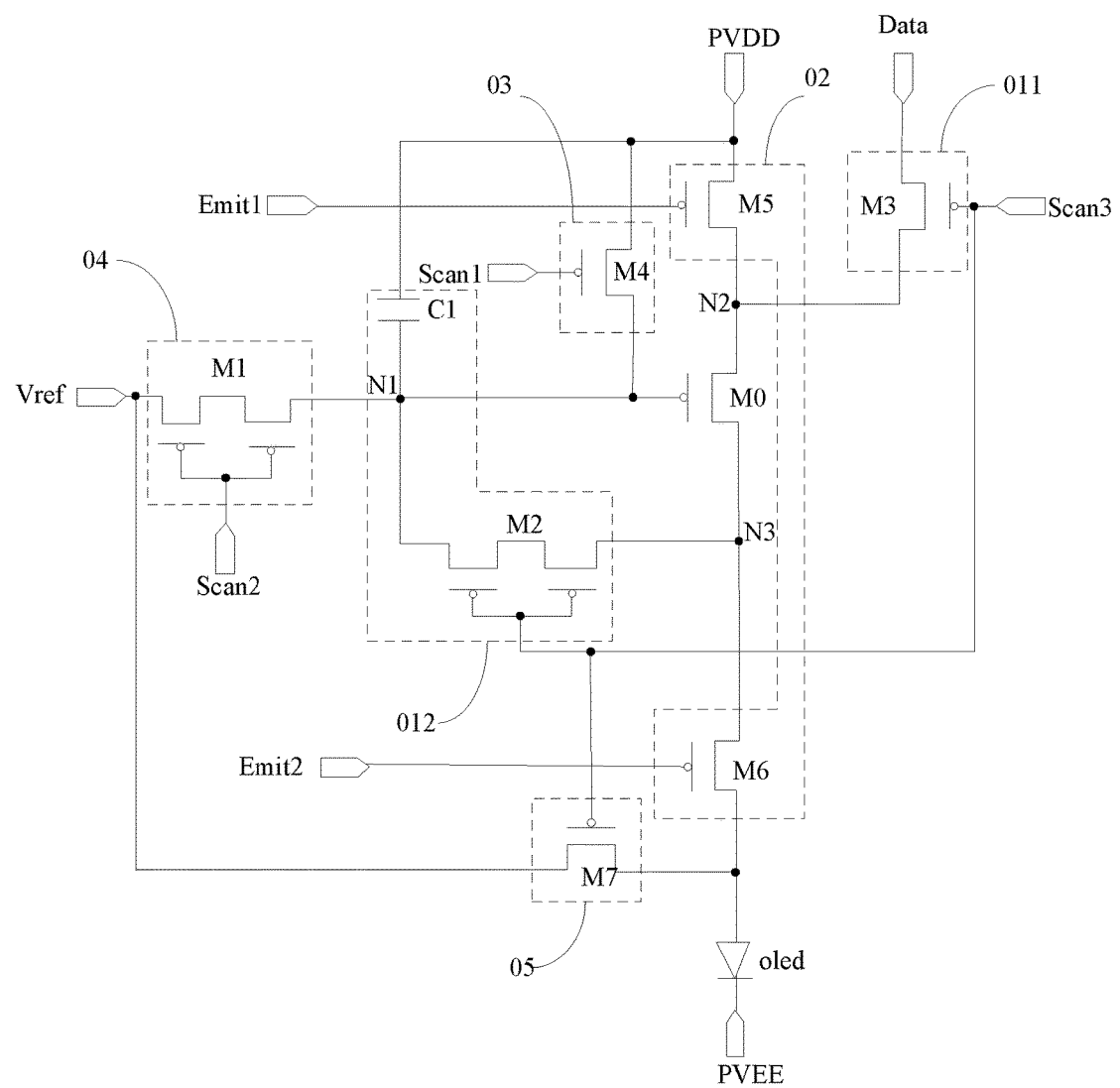
FIG. 4 is a schematic circuit diagram of another pixel circuit according to an embodiment of the disclosure.

Optionally in the pixel circuit according to the embodiment of the disclosure, as illustrated in FIG. 4, the light emitting control module 02 includes a fifth switch transistor M5 and a sixth switch transistor M6, where: the fifth switch transistor M5 has a gate connected with the first light emitting control terminal Emit1, a first electrode connected with the first voltage terminal PVDD, and a second electrode connected with the first electrode of the drive transistor M0.

The sixth switch transistor M6 has a gate connected with the second light emitting control terminal Emit2, a first electrode connected with the second electrode of the drive transistor M0, and a second electrode connected with the anode of the light emitting device oled.

In some embodiments, in the pixel circuit according to the embodiment of the disclosure, when the fifth switch transistor M5 is controlled by the first light emitting control terminal Emit1 to be turned on, the signal of the first voltage terminal PVDD is transmitted to the first electrode of the drive transistor M0 through the fifth switch transistor M5; and when the sixth switch transistor M6 is controlled by the second light emitting control terminal Emit2 to be turned on, the second electrode of the drive transistor M0 is connected with the light emitting device oled.

Optionally in the pixel circuit according to the embodiment of the disclosure, as illustrated in FIG. 5 to FIG. 8, the first light emitting control terminal Emit1 and the second light emitting control terminal Emit2 are the same control terminal Emit.

The particular structure of the light emitting control module in the pixel circuit has been described above only by way of an example, and in a particular implementation, the particular structure of the light emitting control module will not be limited to the structure above according to the embodiment of the disclosure, but can alternatively be another structure known to those skilled in the art, so the embodiment of the disclosure will not be limited thereto.

Optionally in the pixel circuit according to the embodiment of the disclosure, as illustrated in FIG. 4 to FIG. 8, the anode reset module 05 includes a seventh switch transistor M7.

Figure 5:
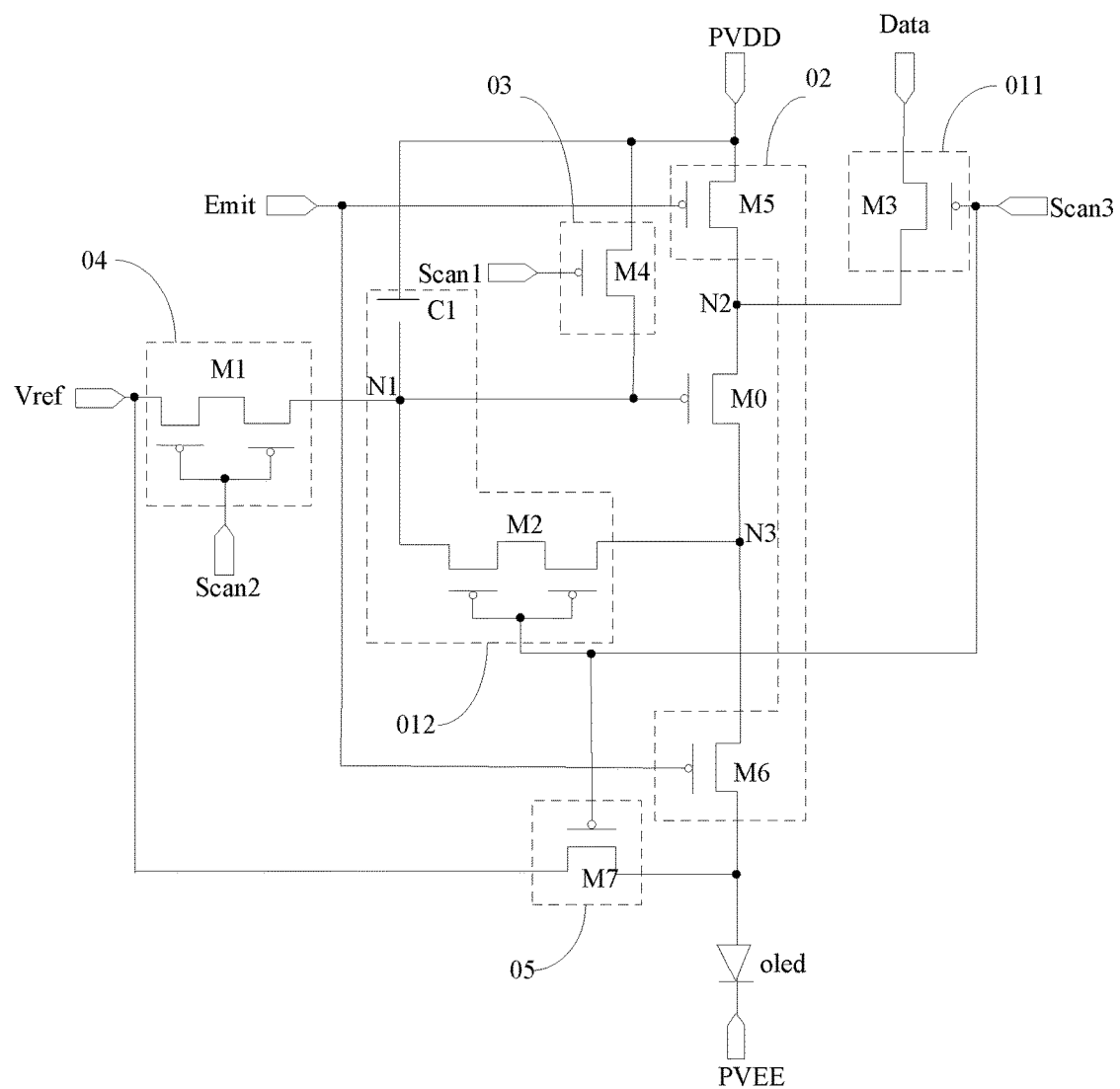
FIG. 5 is a schematic circuit diagram of a further pixel circuit according to an embodiment of the disclosure.
Figure 6:
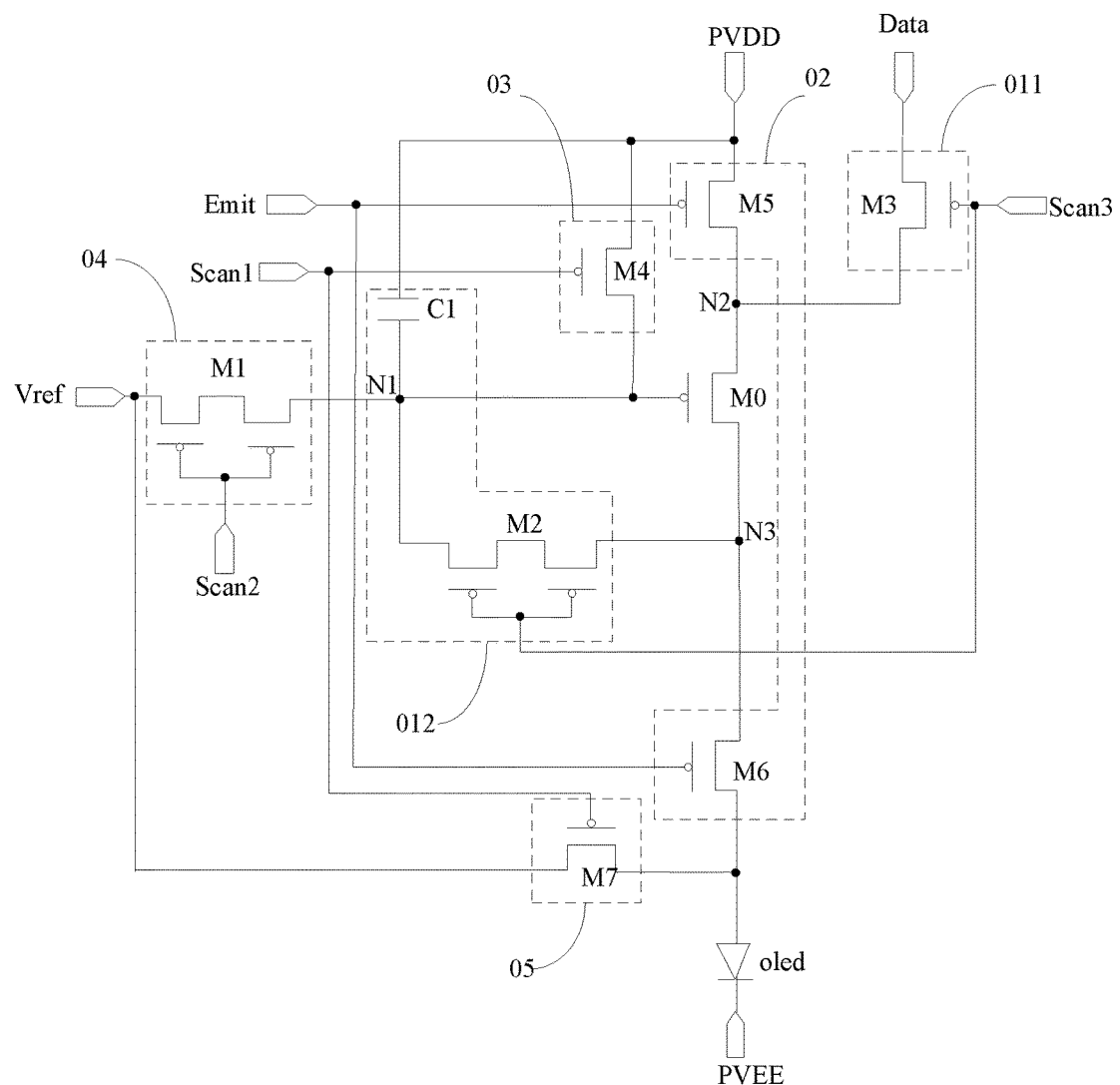
FIG. 6 is a schematic circuit diagram of a further pixel circuit according to an embodiment of the disclosure.
Figure 7:
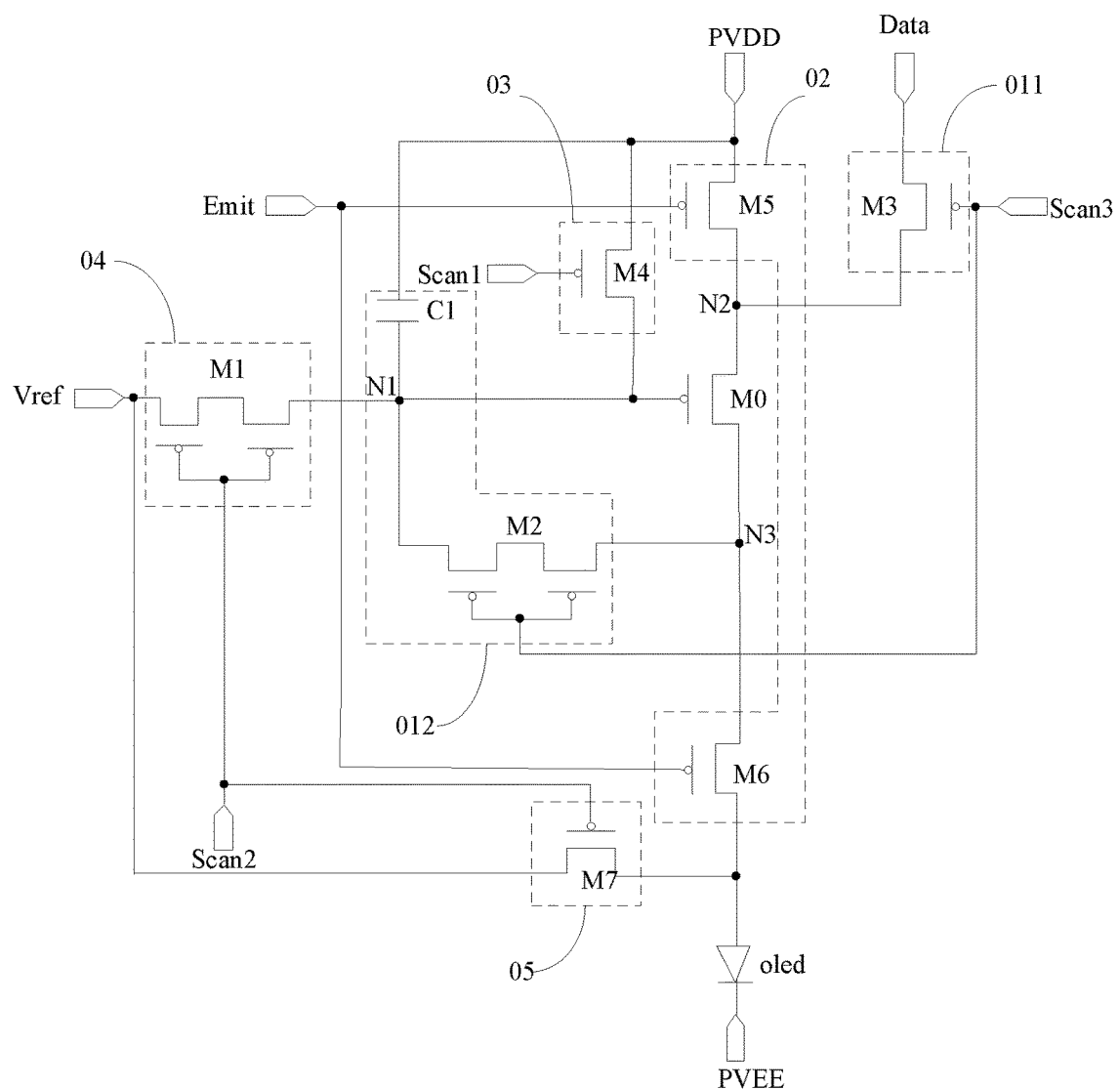
FIG. 7 is a schematic circuit diagram of a further pixel circuit according to an embodiment of the disclosure.
Figure 8:
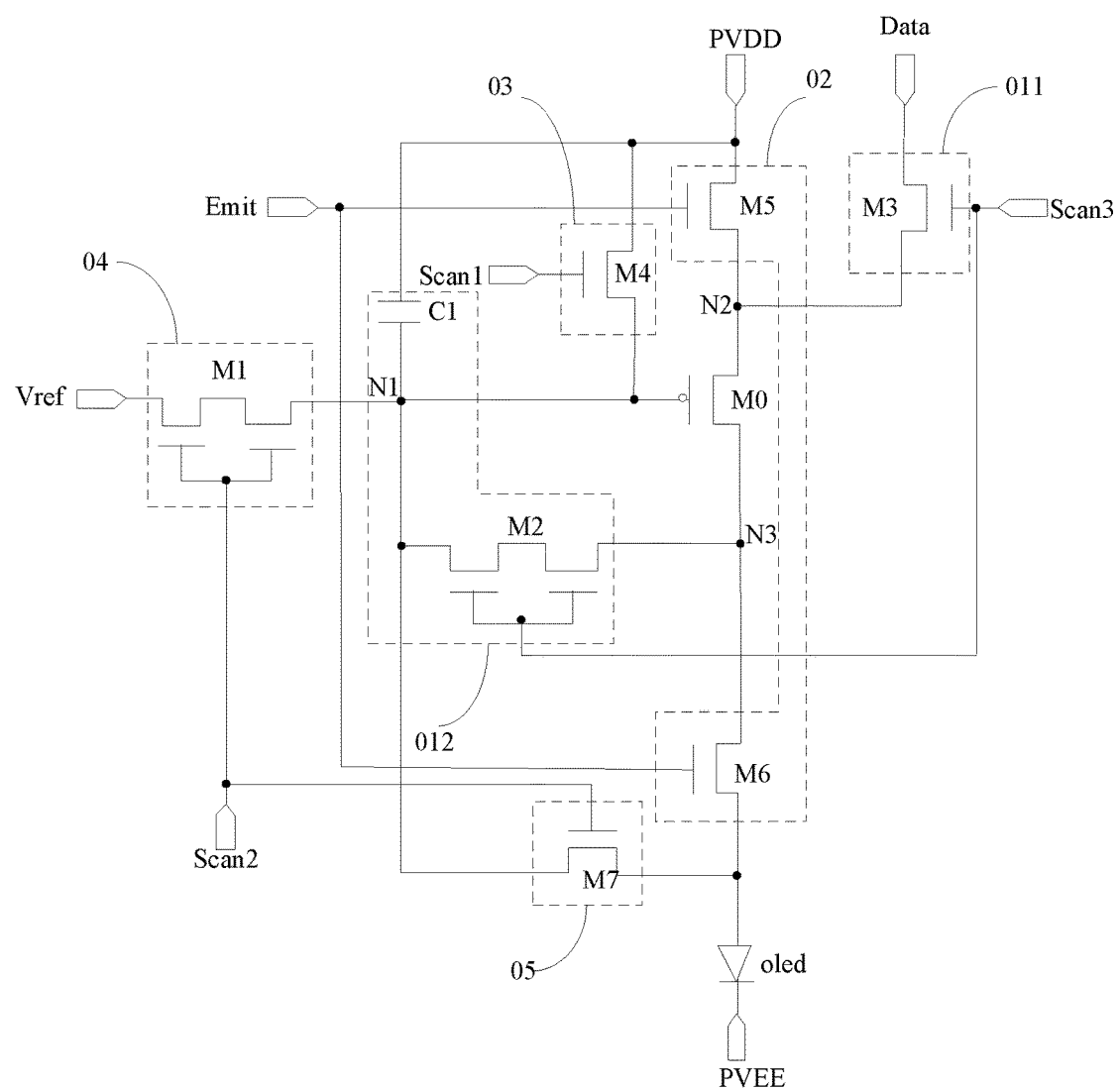
FIG. 8 is a schematic circuit diagram of a further pixel circuit according to an embodiment of the disclosure.

As illustrated in FIG. 4 and FIG. 5, the seventh switch transistor M7 has a gate connected with the third scan signal terminal Scan3, a first electrode connected with the reference signal terminal Vref, and a second electrode connected with the anode of the light emitting device oled; or as illustrated in FIG. 6, the seventh switch transistor M7 has a gate connected with the first scan signal terminal Scan1, a first electrode connected with the reference signal terminal Vref, and a second electrode connected with the anode of the light emitting device oled; or as illustrated in FIG. 7, the seventh switch transistor M7 has a gate connected with the second scan signal terminal Scan2, a first electrode connected with the reference signal terminal Vref, and a second electrode connected with the anode of the light emitting device oled; or as illustrated in FIG. 8, the seventh switch transistor M7 has a gate connected with the second scan signal terminal Scan2, a first electrode connected with the gate of the drive transistor M0, and a second electrode connected with the anode of the light emitting device oled.

In some embodiments, in the pixel circuit according to the embodiment of the disclosure, when the seventh switch transistor M7 is turned on, the signal of the reference signal terminal Vref is transmitted to the anode of the light emitting device oled through the seventh switch transistor M7 to thereby reset the anode of the light emitting device oled.

The particular structure of the anode reset module in the pixel circuit has been described above only by way of an example, and in a particular implementation, the particular structure of the anode reset module will not be limited to the structure above according to the embodiment of the disclosure, but can alternatively be another structure known to those skilled in the art, so the embodiment of the disclosure will not be limited thereto.

In some embodiments, in order to fabricate the pixel circuit in a uniform process, in the pixel circuit according to the embodiment of the disclosure, as illustrated in FIG. 4 to FIG. 7, all the switch transistors are P-type transistors; or as illustrated in FIG. 8, all the switch transistors are P-type transistors or N-type transistors.

In some embodiments, in the pixel circuit according to the embodiment of the disclosure, an N-type transistor is turned on by a high potential signal, and turned off by a low potential signal; and a P-type transistor is turned on by a low potential signal, and turned off by a high potential signal.

In some embodiments, in the pixel circuit according to the embodiment of the disclosure, a first electrode of a transistor can be a source, and a second electrode thereof can be a drain; or a first electrode of a transistor can be a drain, and a second electrode thereof can be a source, although the embodiment of the disclosure will not be limited thereto.

Optionally in the pixel circuit according to the embodiment of the disclosure, in order to reduce leakage current, any one of the switch transistors can be structured with dual gates, although the embodiment of the disclosure will not be limited thereto.

In some embodiments, in the pixel circuit according to the embodiment of the disclosure, a width to length ratio of a channel of the drive transistor is greater than a width to length ratio of a channel of any one of the switch transistors.

In a particular implementation, in the pixel circuit according to the embodiment of the disclosure, the drive transistor M0 is a P-type transistor, and the drive transistor M0 which is an N-type transistor to which the same design principle as the disclosure will be applicable shall also fall into the scope of the disclosure as claimed.

In some embodiments, in the pixel circuit according to the embodiment of the disclosure, as illustrated in FIG. 4 to FIG. 8, the gate of the drive transistor M0 is the first node N1, the first electrode of the drive transistor M0 is the second node N2, and the second electrode of the drive transistor M0 is a third node N3.

An operating process of the pixel circuit according to the embodiment of the disclosure will be described below with reference to a circuit time sequence diagram. In the following description, 1 represents a high potential, and 0 represents a low potential. It shall be noted that 1 and 0 represent logic potentials, and are only intended to better set forth a particular operating process according to an embodiment of the disclosure, but not to suggest any particular voltage values.

FIRST EXAMPLE

Figure 9:
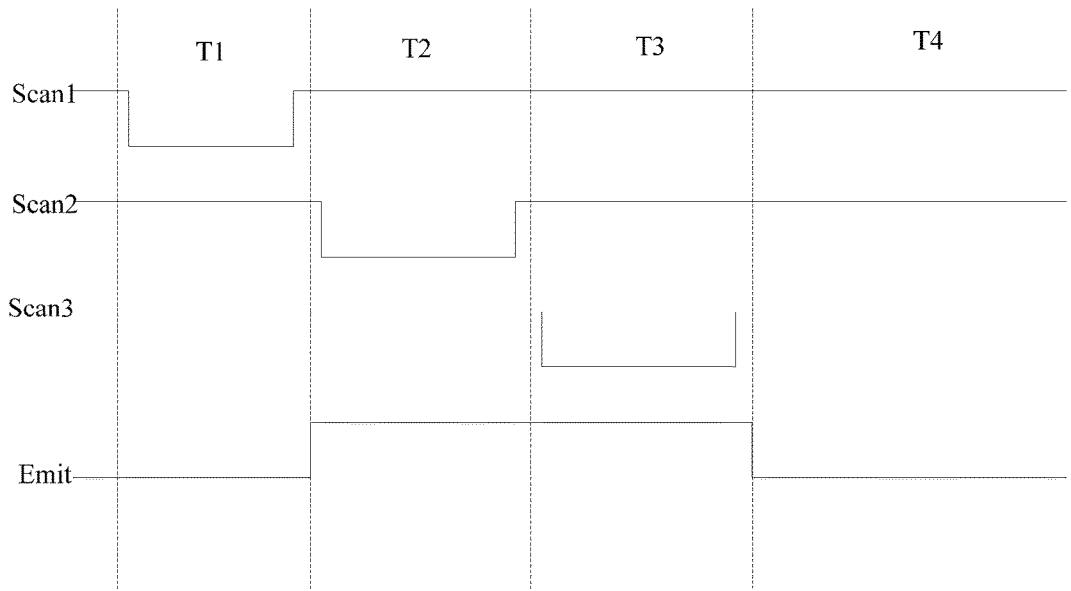
FIG. 9 is an input time sequence diagram corresponding to a pixel circuit according to an embodiment of the disclosure.

Taking the pixel circuit as illustrated in FIG. 5 as an example, all the switch transistors are P-type transistors, and FIG. 9 illustrates a corresponding input-output time sequence diagram thereof. Particularly there are four selected stages T1, T2, T3, and T4 in the input-output time sequence diagram illustrated in FIG. 9.

In the T1 stage (i.e., the initialization stage 1), Scan1=0, Scan2=1, Scan3=1, and Emit=0.

With Scan1=0, the fourth switch transistor M4 is turned on, and the signal of the first voltage terminal PVDD is transmitted to the first node N1 through the fourth switch transistor M4, so the potential of the first node N1 is VDD. With Emit=0, the fifth switch transistor M5 and the sixth switch transistor M6 are turned on. The signal of the first voltage terminal PVDD is transmitted to the second node N2 through the fifth switch transistor M5, so the potential of the second node N2 is VDD. The first node N1 and the second node N2 are at the same potential. With Scan2=1, the first switch transistor M1 is turned off; and with Scan3=1, the second switch transistor M2, the third switch transistor M3, and the seventh switch transistor M7 are turned off, and the light emitting device oled does not emit light.

In the T2 stage (i.e., the initialization stage 2), Scan1=1, Scan2=0, Scan3=1, and Emit=1.

With Scan2=0, the first switch transistor M1 is turned on, the signal of the reference signal terminal Vref is transmitted to the first node N1 through the first switch transistor M1, and the potential of the first node N1 is changed to Vref; and with Scan1=1, the fourth switch transistor M4 is turned off. With Scan3=1, the second switch transistor M2, the third switch transistor M3, and the seventh switch transistor M7 are turned off. With Emit=1, the fifth switch transistor M5 and the sixth switch transistor M6 are turned off, and the light emitting device oled does not emit light. In this stage, the potential of the second node N2 is V2, where V2=VDD+(Vref−VDD)Cgs/(Cgs+C2), Cgs represents a parasitic capacitance between N1 and N2, and C2 represents a parasitic capacitance between N2 and another node. Since the potential of the first node N1 is the same as that of the second node N2 in the T1 stage, V2 remains the same in this stage no matter whether there is a jump from a bright or dark state, so that the gate-source voltage Vsg of the drive transistor M0 remains the same.

In the T3 stage (i.e., the data writing stage), Scan1=1, Scan2=1, Scan3=0, and Emit=1.

With Scan1=1, the fourth switch transistor M4 is turned off. With Scan2=1, the first switch transistor M1 is turned off. With Scan3=0, the second switch transistor M2, the third switch transistor M3, and the seventh switch transistor M7 are turned on. The data signal of the data signal terminal Data is transmitted to the second node N2 through the third switch transistor M3, and the potential of the second node N2 is changed to Vdata; and the second switch transistor M2 connects the gate of the drive transistor M0 with the second electrode thereof, and the potentials of the first node N1 and the third node N3 are changed to Vdata-|Vth|. At this time, the gate-source voltage Vsg of the drive transistor M0 is changed from V2−Vref to Vdata-Vref to |Vth|, so the same threshold voltage can be grabbed no matter whether there is a jump from a high or low grayscale to a middle grayscale; and the seventh switch transistor M7 provides the light emitting device oled with the signal of the reference signal terminal Vref to thereby reset the anode of the light emitting device oled. With Emit=1, the fifth switch transistor M5 and the sixth switch transistor M6 are turned off, and the light emitting device oled does not emit light.

In the T4 stage (i.e., the light emitting stage), Scan1=1, Scan2=1, Scan3=1, and Emit=0.

With Scan1=1, the fourth switch transistor M4 is turned off. With Scan2=1, the first switch transistor M1 is turned off. With Scan3=1, the second switch transistor M2, the third switch transistor M3, and the seventh switch transistor M7 are turned off. With Emit=0, the fifth switch transistor M5 and the sixth switch transistor M6 are turned on, the high potential of the first voltage terminal PVDD is transmitted to the first electrode of the drive transistor M0 through the fifth switch transistor M5, and the potential of the second node N2 is changed to VDD; and at this time, the gate-source voltage of the drive transistor M0 is Vsg=PVDD−Vdata+|Vth|, the drive current of the drive transistor M0 is I=K(Vsg−|Vth|)$^2$=K(PVDD-Vdata)$^2$, and the sixth switch transistor M6 is turned on, so that the light emitting device oled is driven by the drive current of the drive transistor M0 to emit light.

Since K is a structural parameter with a stable value in the same structure, it can be regarded as a constant. As can be apparent, the current flowing to the light emitting device oled will not be affected by the threshold voltage of the drive transistor, thus avoiding any influence from the drifting threshold voltage of the drive transistor so as to alleviate non-uniformity of an image being displayed on the display panel.

SECOND EXAMPLE

Figure 10:
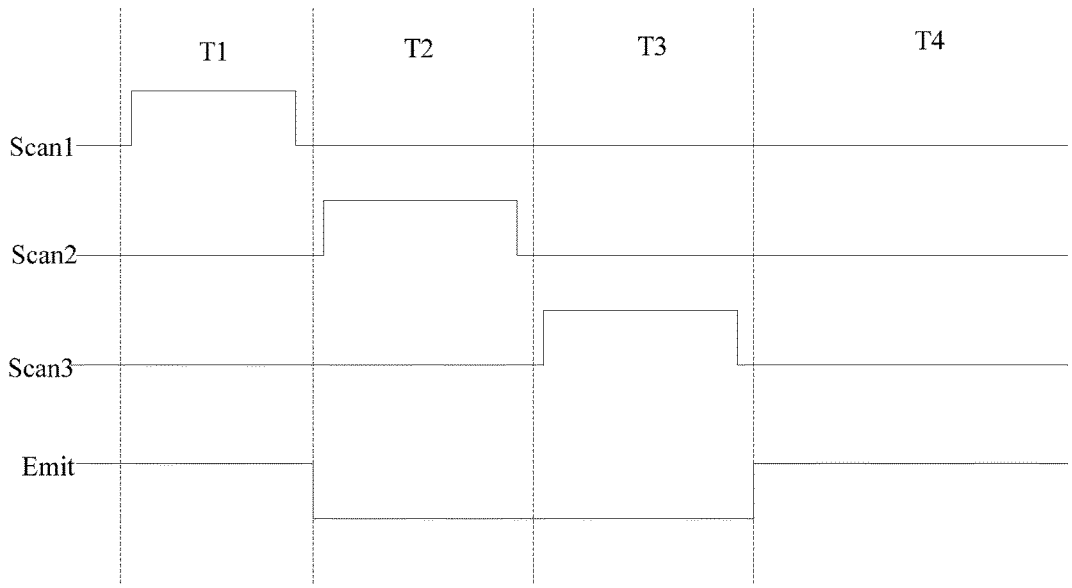
FIG. 10 is another input time sequence diagram corresponding to a pixel circuit according to an embodiment of the disclosure.

Taking the pixel circuit as illustrated in FIG. 8 as an example, all the switch transistors are N-type transistors, and FIG. 10 illustrates a corresponding input-output time sequence diagram thereof. Particularly there are four selected stages T1, T2, T3, and T4 in the input-output time sequence diagram illustrated in FIG. 10.

In the T1 stage (i.e., the initialization stage 1), Scan1=1, Scan2=0, Scan3=0, and Emit=1.

With Scan1=1, the fourth switch transistor M4 is turned on, and the signal of the first voltage terminal PVDD is transmitted to the first node N1 through the fourth switch transistor M4, so the potential of the first node N1 is VDD. With Emit=1, the fifth switch transistor M5 and the sixth switch transistor M6 are turned on. The signal of the first voltage terminal PVDD is transmitted to the second node N2 through the fifth switch transistor M5, so the potential of the second node N2 is VDD. The first node N1 and the second node N2 are at the same potential. With Scan2=0, the first switch transistor M1 and the seventh switch transistor M7 are turned off; and with Scan3=0, the second switch transistor M2 and the third switch transistor M3 are turned off, and the light emitting device oled does not emit light.

In the T2 stage (i.e., the initialization stage 2), Scan1=0, Scan2=1, Scan3=0, and Emit=0.

With Scan2=1, the first switch transistor M1 and the seventh switch transistor M7 are turned on, the signal of the reference signal terminal Vref is transmitted to the first node N1 through the first switch transistor M1, the potential of the first node N1 is changed to Vref, and the seventh switch transistor M7 provides the light emitting device oled with the signal of the first node to thereby reset the anode of the light emitting device oled. With Scan1=0, the fourth switch transistor M4 is turned off. With Scan3=0, the second switch transistor M2 and the third switch transistor M3 are turned off. With Emit=0, the fifth switch transistor M5 and the sixth switch transistor M6 are turned off, and the light emitting device oled does not emit light. In this stage, the potential of the second node N2 is V2, where V2=VDD+(Vref−VDD) Cgs/(Cgs+C2), Cgs represents a parasitic capacitance between N1 and N2, and C2 represents a parasitic capacitance between N2 and another node. Since the potential of the first node N1 is the same as that of the second node N2 in the T1 stage, V2 remains the same in this stage no matter whether there is a jump from a bright or dark state, so that the gate-source voltage Vsg of the drive transistor M0 remains the same.

In the T3 stage (i.e., the data writing stage), Scan1=0, Scan2=0, Scan3=1, and Emit=0.

With Scan1=0, the fourth switch transistor M4 is turned off. With Scan2=0, the first switch transistor M1 and the seventh switch transistor M7 are turned off. With Scan3=1, the second switch transistor M2 and the third switch transistor M3 are turned on. The data signal of the data signal terminal Data is transmitted to the second node N2 through the third switch transistor M3, and the potential of the second node N2 is changed to Vdata; and the second switch transistor M2 connects the gate of the drive transistor M0 with the second electrode thereof, and the potentials of the first node N1 and the third node N3 are changed to Vdata−|Vth|. At this time, the gate-source voltage Vsg of the drive transistor M0 is changed from V2−Vref to Vdata-Vref to |Vth|, so the same threshold voltage can be grabbed no matter whether there is a jump from a high or low grayscale to a middle grayscale; and with Emit=0, the fifth switch transistor M5 and the sixth switch transistor M6 are turned off, and the light emitting device oled does not emit light.

In the T4 stage (i.e., the light emitting stage), Scan1=0, Scan2=0, Scan3=0, and Emit=1.

With Scan1=0, the fourth switch transistor M4 is turned off. With Scan2=0, the first switch transistor M1 and the seventh switch transistor M7 are turned off. With Scan3=0, the second switch transistor M2 and the third switch transistor M3 are turned off. With Emit=1, the fifth switch transistor M5 and the sixth switch transistor M6 are turned on, the high potential of the first voltage terminal PVDD is transmitted to the first electrode of the drive transistor M0 through the fifth switch transistor M5, and the potential of the second node N2 is changed to VDD; and at this time, the gate-source voltage of the drive transistor M0 is Vsg=PVDD−Vdata+|Vth|, the drive current of the drive transistor M0 is I=K(Vsg−|Vth|)$^2$=K(PVDD-Vdata)$^2$, and the sixth switch transistor M6 is turned on, so that the light emitting device oled is driven by the drive current of the drive transistor M0 to emit light.

Since K is a structural parameter with a stable value in the same structure, it can be regarded as a constant. As can be apparent, the current flowing to the light emitting device oled will not be affected by the threshold voltage of the drive transistor, thus avoiding any influence from the drifting threshold voltage of the drive transistor so as to alleviate non-uniformity of an image being displayed on the display panel.

As a result of the simulation on the pixel circuit illustrated in FIG. 4 to FIG. 8, when the (n−1)-th frame is at the grayscale 0, the n-th frame is at the grayscale 255, and the (n+1)-th frame is at the grayscale 255, the potentials of the first node N1 and the second node N2 in different periods of time are detected as depicted in Table 2 below.

TABLE 2

| | Grayscale | | | | | |
| --- | --- | --- | --- | --- | --- | --- |
| | 0 | | 255 | | 255 | |
| Frame No. | (n − 1)-th frame | | n-th frame | | (n + 1)-th frame | |
| Stage | Light emitting Stage | Initialization Stage | Data writing Stage | Light emitting Stage | Initialization Stage | Data writing Stage |

TABLE 2-continued

| | Grayscale | | | | | | | |
|---|---|---|---|---|---|---|---|---|
| | 0 | | | 255 | | | 255 | |
| N1 | 3.44 | 4.6 | −3 | 1.03 | 1.5 | 4.6 | −3 | 1.03 |
| N2 | 4.6 | 4.6 | −0.58 | 3.5 | 4.6 | 4.6 | −0.59 | 3.5 |

As can be apparent from Table 2 above, the potential of the second node N2 in the n-th frame is the same as from the potential of the second node N2 in the (n+1)-th frame in the initialization stage. Particularly the first node N1 is switched to the potential −3V in the n-th frame from 3.44V, and the first node N1 is switched to the potential −3V in the (n+1)-th frame from 1.5V, in the initialization stage; and although there is a parasitic capacitance between the first node N1 and the second node N2 in the pixel circuit, the potential of the second node n2 is reset to 4.6V by the first voltage terminal in the initialization stage, so the change in voltage ΔV of the first node N1 will not have any influence upon the potential of the second node N2 in the n-th frame, and the potential of the second node N2 in the (n+1)-th frame in the initialization stage, and thus will not have any influence upon the potential of the first node N1 in the n-th frame, and the potential of the first node N1 in the (n+1)-th frame in the data writing stage, so that the brightness of the n-th frame will be the same as the brightness of the (n+1)-th frame.

Figure 11:
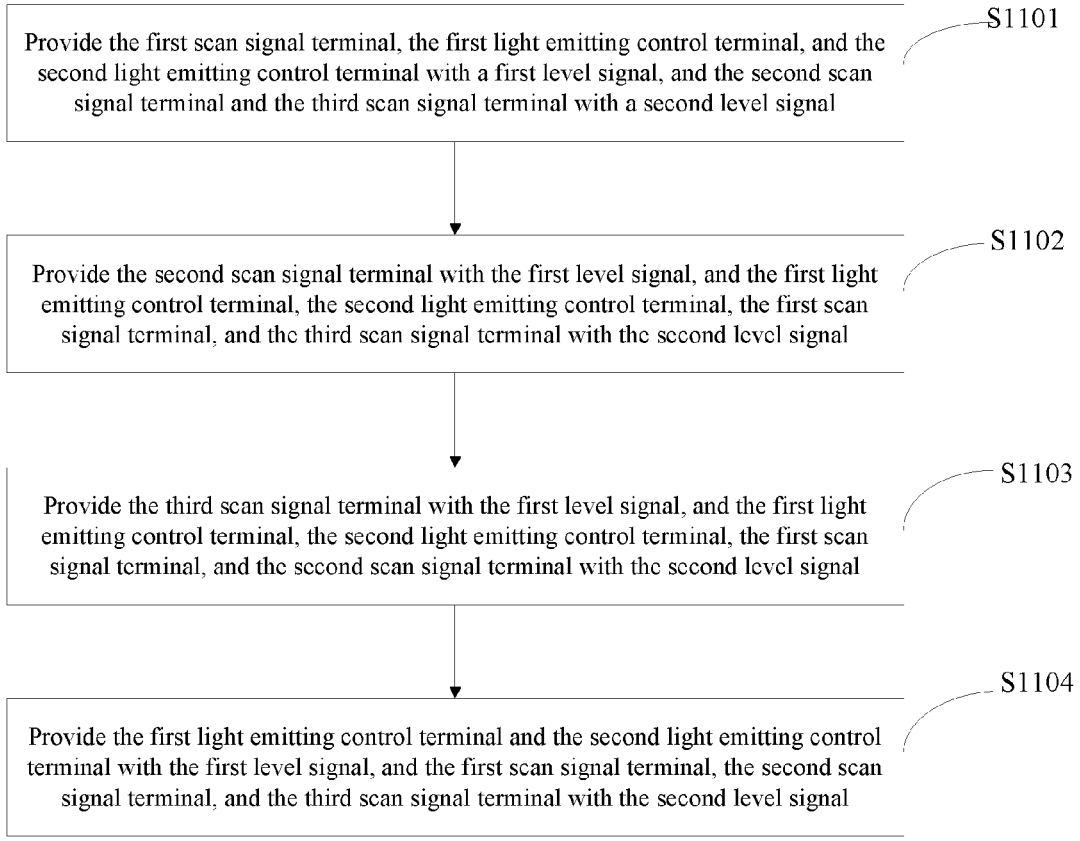
FIG. 11 is a flow chart of a method for driving a pixel circuit according to an embodiment of the disclosure.

Based upon the same inventive idea, an embodiment of the disclosure further provides a method for driving the pixel circuit according to any one of the embodiments above of the disclosure, and as illustrated in FIG. 11, the method includes the following stages.

S1101 is to perform a first stage of providing the first scan signal terminal, the first light emitting control terminal, and the second light emitting control terminal with a first level signal, and providing the second scan signal terminal and the third scan signal terminal with a second level signal.

S1102 is to perform a second stage of providing the second scan signal terminal with the first level signal, and providing the first light emitting control terminal, the second light emitting control terminal, the first scan signal terminal, and the third scan signal terminal with the second level signal.

S1103 is to perform a third stage of providing the third scan signal terminal with the first level signal, and providing the first light emitting control terminal, the second light emitting control terminal, the first scan signal terminal, and the second scan signal terminal with the second level signal.

S1104 is to perform a fourth stage of providing the first light emitting control terminal and the second light emitting control terminal with the first level signal, and providing the first scan signal terminal, the second scan signal terminal, and the third scan signal terminal with the second level signal.

In some embodiments, in the driving method illustrated in FIG. 11, when the first level signal is a low potential signal, and the second level signal is a high potential signal, a corresponding time sequence diagram thereof is as illustrated in FIG. 9, and reference can be made to the first example for a particular operating principle thereof; and when the first level signal is a high potential signal, and the second level signal is a low potential signal, a corresponding time sequence diagram thereof is as illustrated in FIG. 10, and reference can be made to the second example for a particular operating principle thereof; so a repeated description thereof will be omitted here.

Figure 12:
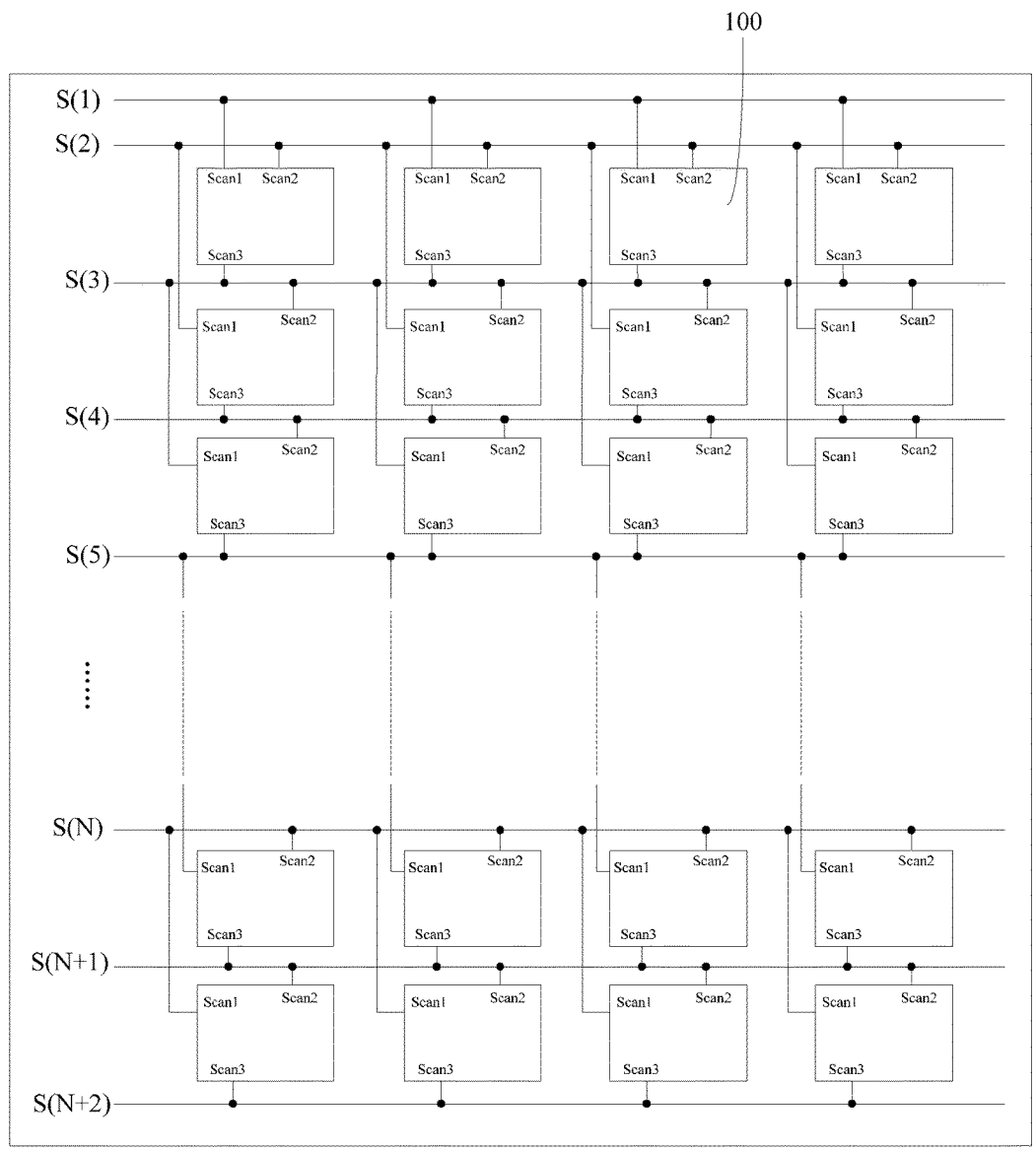
FIG. 12 is a schematic circuit diagram of a display panel according to an embodiment of the disclosure.

Based upon the same inventive idea, an embodiment of the disclosure further provides a display panel as illustrated in FIG. 12 including N rows of pixel circuits 100 according to any one of the embodiments above of the disclosure, and N+2 scan lines S(1) to S(N+2), where N is an integer greater than 0.

The first scan signal terminals Scan1 of the n-th row of pixel circuits are connected with the n-th scan line S(n), the second scan signal terminals Scan2 of the n-th row of pixel circuits are connected with the (n+1)-th scan line S(n+1), and the third scan signal terminals Scan3 of the n-th row of pixel circuits are connected with the (n+2)-th scan line S(n+2), where n=1, 2, 3, . . . , N. Any row of pixel circuits can be connected with the upper and lower scan lines to thereby dispense with wiring in the display panel so as to improve an aperture ratio.

Figure 13:
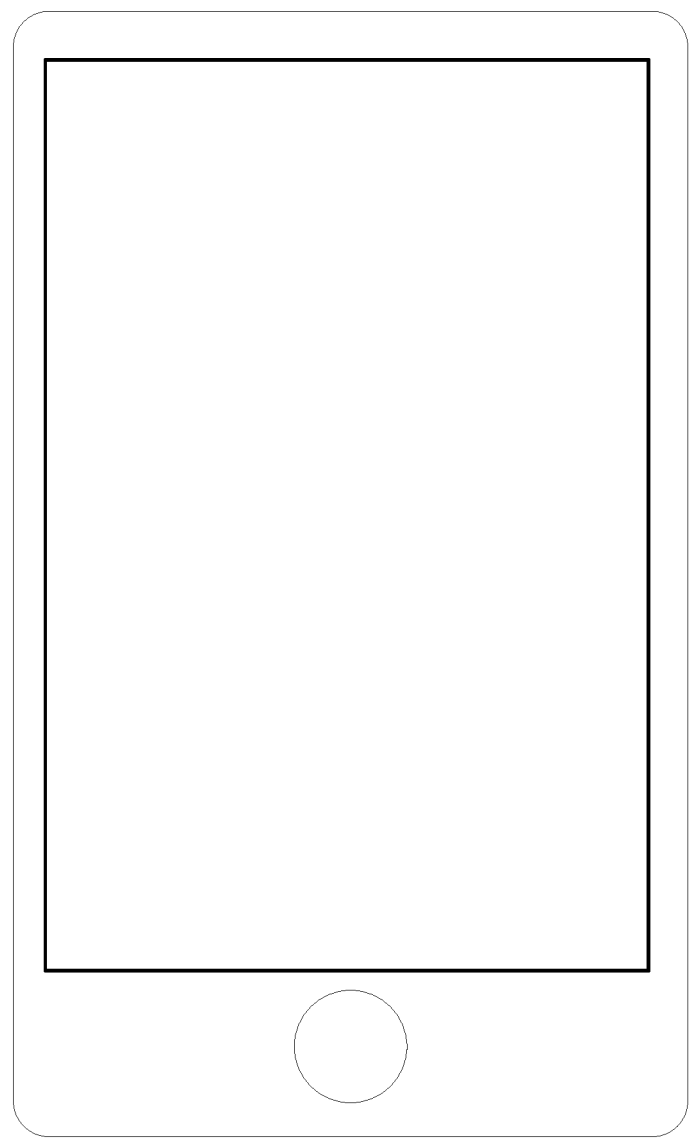
FIG. 13 is a schematic structural diagram of a display device according to an embodiment of the disclosure.

Based upon the same inventive idea, an embodiment of the disclosure further provides a display device including the display panel according to the embodiment above of the disclosure. The display device can be a mobile phone as illustrated in FIG. 13, or can be a tablet computer, a TV set, a monitor, a notebook computer, a digital photo frame, a navigator, or any other product or component with a display function. Since the display device addresses the problem under a similar principle to the display panel above, reference can be made to the implementation of the display panel above for an implementation of the display device, so a repeated description thereof will be omitted here.

In the pixel circuit, the method for driving the same, the display panel, and the display device according to the embodiment of the disclosure, before the drive control module controls the drive transistor to drive the light emitting device to emit light, the node reset module provides the gate of the drive transistor with the signal of the first voltage terminal; and also while the node reset module is providing the gate of the drive transistor with the signal of the first voltage terminal, the light emitting control module provides the first electrode of the drive transistor with the signal of the first voltage terminal, that is, both the gate and the first electrode of the drive transistor are reset using the signal of the first voltage terminal before the light emitting device emits light to thereby avoid their difference in voltage arising from the parasitic capacitance between them so as to avoid the problem of threshold voltage being differently grabbed due to a voltage jump, thus guaranteeing consistent brightness of the first frame after the image is switched between high and low grayscales. Furthermore the drive transistor is completely reset in the initialization stage of each frame, so that also an afterimage can be prevented from occurring as a result of the deviating threshold voltage of the driver.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A pixel circuit, comprising:
    a drive transistor;
    a drive control module comprising a data writing sub-module and a threshold compensation sub-module;
    a light emitting control module;
    a node reset module;
    a node initialization module; and
    a light emitting device;

wherein the drive control module is configured to control the drive transistor to drive the light emitting device to emit light;

wherein the data writing sub-module is configured to provide a first electrode of the drive transistor with a data signal of a data signal terminal under control of a third scan signal terminal;

wherein the threshold compensation sub-module is configured to write the data signal received at the first electrode of the drive transistor, and wherein threshold voltage of the drive transistor into a gate of the drive transistor under control of the third scan signal terminal;

wherein the node reset module is configured to provide the gate of the drive transistor with a signal of a first voltage terminal under control of a first scan signal terminal before the drive control module controls the drive transistor to drive the light emitting device to emit light;

wherein the node initialization module is configured to provide the gate of the drive transistor with a signal of a reference signal terminal under control of a second scan signal terminal after the node reset module provides the gate of the drive transistor with the signal of the first voltage terminal, and before the drive control module controls the drive transistor to drive the light emitting device to emit light, wherein voltage of the reference signal terminal is different from voltage of the first voltage terminal;

wherein the light emitting control module is configured to provide the first electrode of the drive transistor with the signal of the first voltage terminal under control of a first light emitting control terminal when the node reset module is providing the gate of the drive transistor with the signal of the first voltage terminal, and wherein the light emitting control module is configured to provide an anode of the light emitting device with the signal of the first voltage terminal through the drive transistor when the light emitting device is emitting light; and wherein the light emitting control module is configured to connect a second electrode of the drive transistor with the anode of the light emitting device under control of a second light emitting control terminal.

2. The pixel circuit according to claim 1, wherein the first light emitting control terminal and the second light emitting control terminal are a same control terminal.

3. The pixel circuit according to claim 1, wherein the pixel circuit further comprises an anode reset module;
wherein the anode reset module is configured to provide the anode of the light emitting device with the signal of the reference signal terminal under control of the third scan signal terminal or the second scan signal terminal or the first scan signal terminal.

4. The pixel circuit according to claim 1, wherein the node initialization module comprises a first switch transistor, wherein the first switch transistor has a gate connected with the second scan signal terminal, a first electrode connected with the reference signal terminal, and a second electrode connected the gate of the drive transistor.

5. The pixel circuit according to claim 4, wherein the first switch transistor is structured with dual gates.

6. The pixel circuit according to claim 1, wherein the threshold compensation sub-module comprises a second switch transistor and a capacitor;
wherein the second switch transistor has a gate connected with the third scan signal terminal, a first electrode connected with the second electrode of the drive transistor, and a second electrode connected with the gate of the drive transistor; and
wherein the capacitor has one terminal connected with the first voltage terminal, and other terminal connected with the gate of the drive transistor.

7. The pixel circuit according to claim 6, wherein the second switch transistor is structured with dual gates.

8. The pixel circuit according to claim 1, wherein the data writing sub-module comprises a third switch transistor, wherein the third switch transistor has a gate connected with the third scan signal terminal, a first electrode connected with the data signal terminal, and a second electrode connected with the first electrode of the drive transistor.

9. The pixel circuit according to claim 1, wherein the node reset module comprises a fourth switch transistor;
wherein the fourth switch transistor has a gate connected with the first scan signal terminal, a first electrode connected with the first voltage terminal, and a second electrode connected with the gate of the drive transistor.

10. The pixel circuit according to claim 1, wherein the light emitting control module comprises a fifth switch transistor and a sixth switch transistor;
wherein the fifth switch transistor has a gate connected with the first light emitting control terminal, a first electrode connected with the first voltage terminal, and a second electrode connected with the first electrode of the drive transistor; and
wherein the sixth switch transistor has a gate connected with the second light emitting control terminal, a first electrode connected with the second electrode of the drive transistor, and a second electrode connected with the anode of the light emitting device.

11. The pixel circuit according to claim 3, wherein the anode reset module comprises a seventh switch transistor;
wherein the seventh switch transistor has a gate connected with the third scan signal terminal or the second scan signal terminal or the first scan signal terminal, and wherein the seventh switch transistor has a first electrode connected with the reference signal terminal, and a second electrode connected with the anode of the light emitting device.

12. The pixel circuit according to claim 3, wherein the anode reset module comprises a seventh switch transistor;
wherein the seventh switch transistor has a gate connected with the second scan signal terminal, a first electrode connected with the gate of the drive transistor, and a second electrode connected with the anode of the light emitting device.

13. The pixel circuit according to claim 1, wherein the node initialization module comprises a first switch transistor, wherein the threshold compensation sub-module comprises a second switch transistor, wherein the data writing sub-module comprises a third switch transistor, wherein the node reset module comprises a fourth switch transistor, wherein the light emitting control module comprises a fifth switch transistor and a sixth switch transistor, and wherein all the switch transistors are P-type transistors or all the switch transistors are N-type transistors.

14. The pixel circuit according to claim 3, wherein the node initialization module comprises a first switch transistor, wherein the threshold compensation sub-module comprises a second switch transistor, wherein the data writing sub-module comprises a third switch transistor, wherein the node reset module comprises a fourth switch transistor, wherein the light emitting control module comprises a fifth switch transistor and a sixth switch transistor, wherein the anode reset module comprises a seventh switch transistor, and wherein all the switch transistors are P-type transistors or all the switch transistors are N-type transistors.

15. The pixel circuit according to claim 1, wherein the node initialization module comprises a first switch transistor, wherein the threshold compensation sub-module comprises a second switch transistor, wherein the data writing sub-module comprises a third switch transistor, wherein the node reset module comprises a fourth switch transistor, wherein the light emitting control module comprises a fifth switch transistor and a sixth switch transistor, and wherein a width to length ratio of a channel of the drive transistor is greater than a width to length ratio of a channel of any one of the switch transistors.

16. The pixel circuit according to claim 3, wherein the node initialization module comprises a first switch transistor, wherein the threshold compensation sub-module comprises a second switch transistor, wherein the data writing sub-module comprises a third switch transistor, the node reset module comprises a fourth switch transistor, wherein the light emitting control module comprises a fifth switch transistor and a sixth switch transistor, wherein the anode reset module comprises a seventh switch transistor, and wherein a width to length ratio of a channel of the drive transistor is greater than a width to length ratio of a channel of any one of the switch transistors.

17. A method for driving the pixel circuit according to claim 1, the method comprising:
  a first stage of providing the first scan signal terminal, the first light emitting control terminal, and the second light emitting control terminal with a first level signal, and providing the second scan signal terminal and the third scan signal terminal with a second level signal;
  wherein a second stage of providing the second scan signal terminal with the first level signal, and providing the first light emitting control terminal, the second light emitting control terminal, the first scan signal terminal, and the third scan signal terminal with the second level signal;
  a third stage of providing the third scan signal terminal with the first level signal, and providing the first light emitting control terminal, the second light emitting control terminal, the first scan signal terminal, and the second scan signal terminal with the second level signal; and
  a fourth stage of providing the first light emitting control terminal and the second light emitting control terminal with the first level signal, and providing the first scan signal terminal, the second scan signal terminal, and the third scan signal terminal with the second level signal.

18. A display panel, comprising N rows of pixel circuits according to claim 1, and N+2 scan lines;
  wherein the first scan signal terminals of an n-th row of pixel circuits are connected with an n-th scan line, the second scan signal terminals of the n-th row of pixel circuits are connected with an (n+1)-th scan line, and the third scan signal terminals of the n-th row of pixel circuits are connected with an (n+2)-th scan line, wherein n=1, 2, 3, . . . , N, and wherein N is an integer greater than 0.

* * * * *